US012664346B1

(12) United States Patent
Khankin et al.

(10) Patent No.: US 12,664,346 B1
(45) Date of Patent: Jun. 23, 2026

(54) SYSTEM AND METHOD OF COMPUTING FUNCTIONS APPROXIMATION

(71) Applicant: NEXT SILICON LTD., Givatayim (IL)

(72) Inventors: Daniel Khankin, Beer Sheva (IL);
Aharon Abadi, Petah Tiqwa (IL)

(73) Assignee: NEXT SILICON LTD., Givatayim (IL)

( * ) Notice: Subject to any disclaimer, the term of this patent is extended or adjusted under 35 U.S.C. 154(b) by 0 days.

(21) Appl. No.: 19/231,536

(22) Filed: Jun. 8, 2025

(51) Int. Cl.
*G06F 30/392* (2020.01)

(52) U.S. Cl.
CPC .................................. *G06F 30/392* (2020.01)

(58) Field of Classification Search
USPC .......................................................... 716/119
See application file for complete search history.

(56) References Cited

U.S. PATENT DOCUMENTS

| | | | |
|---|---|---|---|
| 8,190,669 | B1 | 5/2012 | Oberman |
| 10,168,990 | B1 | 1/2019 | Annamalai |
| 2004/0260523 | A1 | 12/2004 | Yang |
| 2019/0310827 | A1 | 10/2019 | Gagliano |
| 2021/0406662 | A1* | 12/2021 | Timofejevs ............. G06F 30/39 |
| 2021/0406667 | A1* | 12/2021 | Timofejevs .............. G06N 5/04 |
| 2023/0081715 | A1* | 3/2023 | Timofejevs ............ G06N 3/065 |
| | | | 706/21 |
| 2025/0006094 | A1 | 1/2025 | Huang |
| 2025/0060941 | A1 | 2/2025 | Pasca et al. |
| 2025/0139197 | A1 | 5/2025 | Diamond |

OTHER PUBLICATIONS

Muller, J.-M. (2016). Elementary Functions: Algorithms and Implementation. 3rd Edition. Birkhäuser Boston, MA. Springer Science+ Business Media New York 2016. https://doi.org/10.1007/978-1-4899-7983-4.
Tang, P.-T. P. 1989. Table-driven implementation of the exponential function in IEEE floating-point arithmetic. ACM Trans. Math. Softw. 15, 2 (Jun. 1989), 144-157. https://doi.org/10.1145/63522.214389.
Official Action Dated May 28, 2025 From the US Patent and Trademark Office Re. U.S. Appl. No. 19/057,696. (40 pages).

(Continued)

*Primary Examiner* — Mohammed Alam
(74) *Attorney, Agent, or Firm* — The Roy Gross Law Firm, LLC; Roy D. Gross

(57) ABSTRACT

A system and method of designing an integrated circuit for calculating an approximation of a target function over a predetermined interval may include employing an approximation algorithm, to calculate a first approximation function, which approximates the target function. Embodiments may construct an objective function based on the first approximation function. Based on the objective function, embodiments may calculate a first set of outcome coefficient values, which define an outcome approximation function, and generate, based on the outcome approximation function, an approximation schematic. The approximation schematic may represent an electrical approximation circuit, adapted to (i) receive an input value within the predetermined interval, and (ii) produce an estimation of the mathematical function at the input value, according to the outcome approximation function.

20 Claims, 7 Drawing Sheets

(56) References Cited

OTHER PUBLICATIONS

Official Action Dated Apr. 4, , 2025 From the US Patent and Trademark Office Re. U.S. Appl. No. 19/057,696. (7 pages).

Applicant-Initiated Interview Summary Dated Jul. 7, 2025 From the US Patent Trademark Office Re. U.S. Appl. No. 19/057,696. (11 Pages).

Devor et al. "A Probalistic Model for Rounding Errors: A New Look at the Table-Maker's Dilemma", Proceedings of the 8th International Symposium of Cyber Security, Cryptology, and Machine Learning, CSCML 2024, Be'er Sheva, Israel, Dec. 19-20, 2024, p. 190-200, Dec. 19, 2024. https://doi.org/10.1007/978-3-031-76934-4_17.

Khankin et al. "Efficient CORDIC-Based Shine and Cosine Implementation for A Dataflow Architecture (Extended Abstract)", Cyber Security Cryptography and Machine Learning, Conference Paper, LNCS, 12161: 128-142, Published Online Jun. 25, 2020. https://doi.org/10.1007/978-3-030-49785-9_9.

* cited by examiner

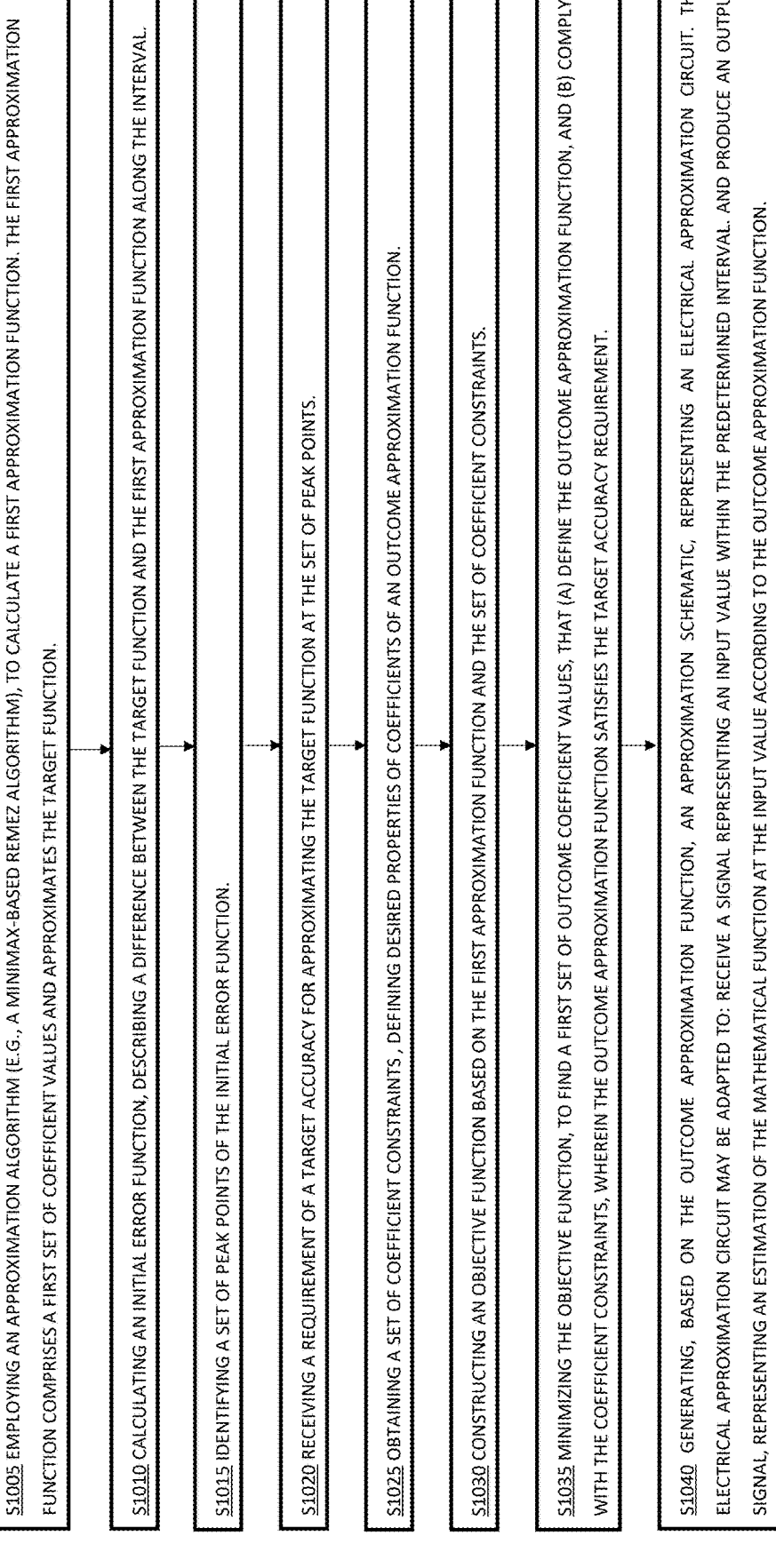

S1005 EMPLOYING AN APPROXIMATION ALGORITHM (E.G., A MINIMAX-BASED REMEZ ALGORITHM), TO CALCULATE A FIRST APPROXIMATION FUNCTION. THE FIRST APPROXIMATION FUNCTION COMPRISES A FIRST SET OF COEFFICIENT VALUES AND APPROXIMATES THE TARGET FUNCTION.

S1010 CALCULATING AN INITIAL ERROR FUNCTION, DESCRIBING A DIFFERENCE BETWEEN THE TARGET FUNCTION AND THE FIRST APPROXIMATION FUNCTION ALONG THE INTERVAL.

S1015 IDENTIFYING A SET OF PEAK POINTS OF THE INITIAL ERROR FUNCTION.

S1020 RECEIVING A REQUIREMENT OF A TARGET ACCURACY FOR APPROXIMATING THE TARGET FUNCTION AT THE SET OF PEAK POINTS.

S1025 OBTAINING A SET OF COEFFICIENT CONSTRAINTS , DEFINING DESIRED PROPERTIES OF COEFFICIENTS OF AN OUTCOME APPROXIMATION FUNCTION.

S1030 CONSTRUCTING AN OBJECTIVE FUNCTION BASED ON THE FIRST APPROXIMATION FUNCTION AND THE SET OF COEFFICIENT CONSTRAINTS.

S1035 MINIMIZING THE OBJECTIVE FUNCTION, TO FIND A FIRST SET OF OUTCOME COEFFICIENT VALUES, THAT (A) DEFINE THE OUTCOME APPROXIMATION FUNCTION, AND (B) COMPLY WITH THE COEFFICIENT CONSTRAINTS, WHEREIN THE OUTCOME APPROXIMATION FUNCTION SATISFIES THE TARGET ACCURACY REQUIREMENT.

S1040 GENERATING, BASED ON THE OUTCOME APPROXIMATION FUNCTION, AN APPROXIMATION SCHEMATIC, REPRESENTING AN ELECTRICAL APPROXIMATION CIRCUIT. THE ELECTRICAL APPROXIMATION CIRCUIT MAY BE ADAPTED TO: RECEIVE A SIGNAL REPRESENTING AN INPUT VALUE WITHIN THE PREDETERMINED INTERVAL. AND PRODUCE AN OUTPUT SIGNAL, REPRESENTING AN ESTIMATION OF THE MATHEMATICAL FUNCTION AT THE INPUT VALUE ACCORDING TO THE OUTCOME APPROXIMATION FUNCTION.

FIG. 5

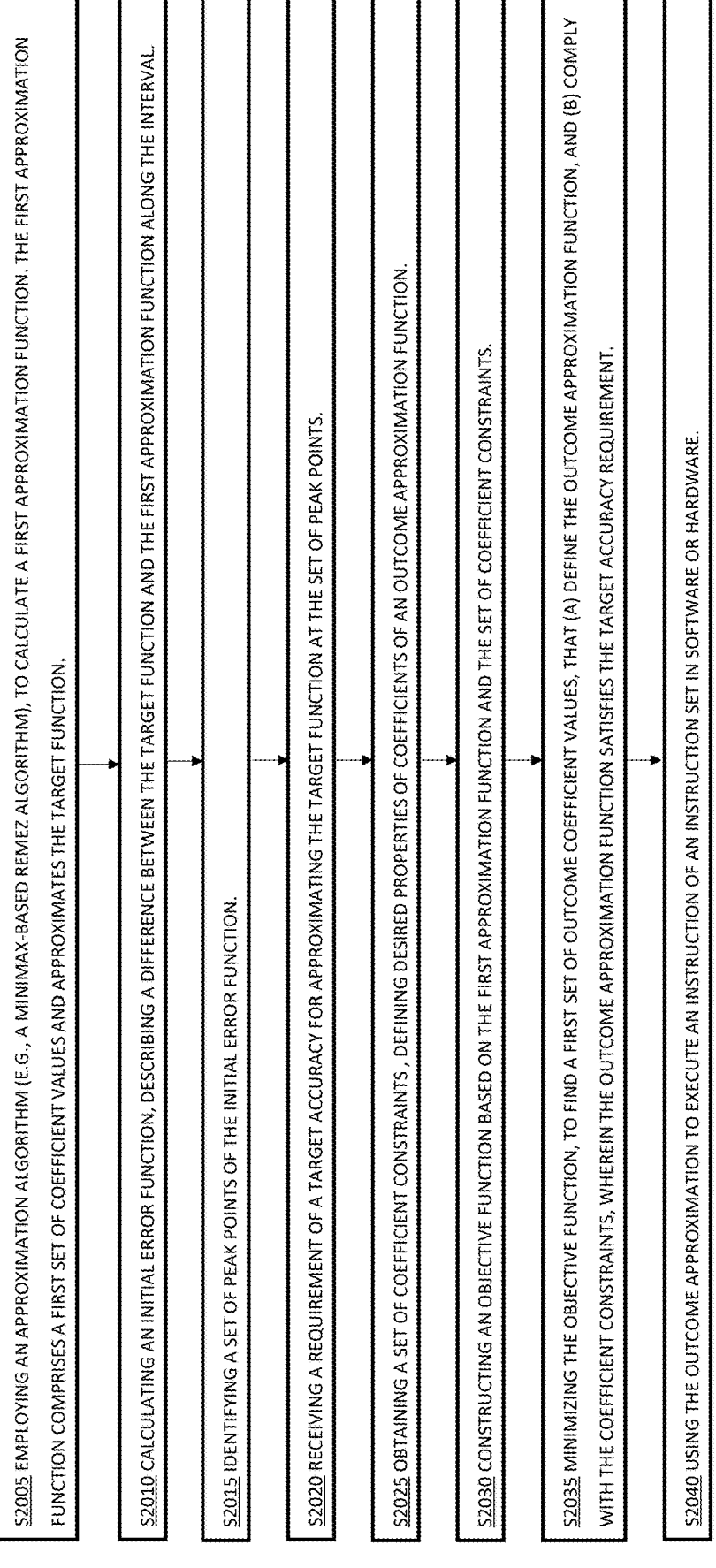

S2005 EMPLOYING AN APPROXIMATION ALGORITHM (E.G., A MINIMAX-BASED REMEZ ALGORITHM), TO CALCULATE A FIRST APPROXIMATION FUNCTION. THE FIRST APPROXIMATION FUNCTION COMPRISES A FIRST SET OF COEFFICIENT VALUES AND APPROXIMATES THE TARGET FUNCTION.

S2010 CALCULATING AN INITIAL ERROR FUNCTION, DESCRIBING A DIFFERENCE BETWEEN THE TARGET FUNCTION AND THE FIRST APPROXIMATION FUNCTION ALONG THE INTERVAL.

S2015 IDENTIFYING A SET OF PEAK POINTS OF THE INITIAL ERROR FUNCTION.

S2020 RECEIVING A REQUIREMENT OF A TARGET ACCURACY FOR APPROXIMATING THE TARGET FUNCTION AT THE SET OF PEAK POINTS.

S2025 OBTAINING A SET OF COEFFICIENT CONSTRAINTS , DEFINING DESIRED PROPERTIES OF COEFFICIENTS OF AN OUTCOME APPROXIMATION FUNCTION.

S2030 CONSTRUCTING AN OBJECTIVE FUNCTION BASED ON THE FIRST APPROXIMATION FUNCTION AND THE SET OF COEFFICIENT CONSTRAINTS.

S2035 MINIMIZING THE OBJECTIVE FUNCTION, TO FIND A FIRST SET OF OUTCOME COEFFICIENT VALUES, THAT (A) DEFINE THE OUTCOME APPROXIMATION FUNCTION, AND (B) COMPLY WITH THE COEFFICIENT CONSTRAINTS, WHEREIN THE OUTCOME APPROXIMATION FUNCTION SATISFIES THE TARGET ACCURACY REQUIREMENT.

S2040 USING THE OUTCOME APPROXIMATION TO EXECUTE AN INSTRUCTION OF AN INSTRUCTION SET IN SOFTWARE OR HARDWARE.

FIG. 6

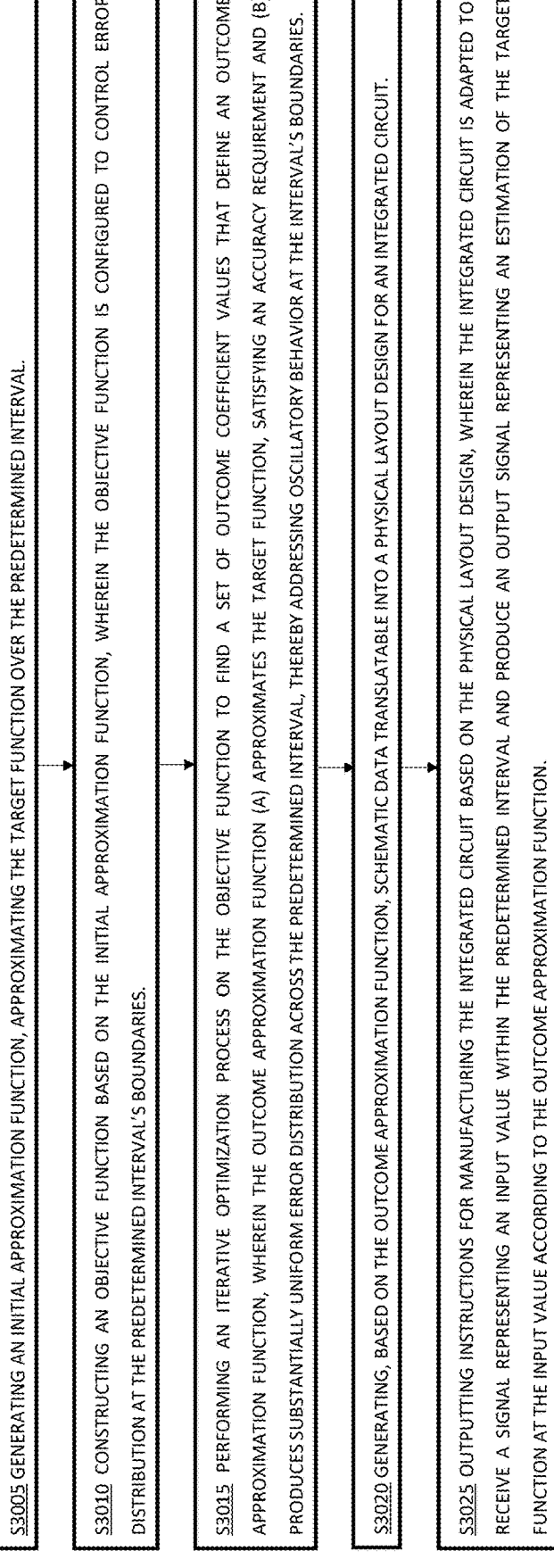

S3005 GENERATING AN INITIAL APPROXIMATION FUNCTION, APPROXIMATING THE TARGET FUNCTION OVER THE PREDETERMINED INTERVAL.

S3010 CONSTRUCTING AN OBJECTIVE FUNCTION BASED ON THE INITIAL APPROXIMATION FUNCTION, WHEREIN THE OBJECTIVE FUNCTION IS CONFIGURED TO CONTROL ERROR DISTRIBUTION AT THE PREDETERMINED INTERVAL'S BOUNDARIES.

S3015 PERFORMING AN ITERATIVE OPTIMIZATION PROCESS ON THE OBJECTIVE FUNCTION TO FIND A SET OF OUTCOME COEFFICIENT VALUES THAT DEFINE AN OUTCOME APPROXIMATION FUNCTION, WHEREIN THE OUTCOME APPROXIMATION FUNCTION (A) APPROXIMATES THE TARGET FUNCTION, SATISFYING AN ACCURACY REQUIREMENT AND (B) PRODUCES SUBSTANTIALLY UNIFORM ERROR DISTRIBUTION ACROSS THE PREDETERMINED INTERVAL, THEREBY ADDRESSING OSCILLATORY BEHAVIOR AT THE INTERVAL'S BOUNDARIES.

S3020 GENERATING, BASED ON THE OUTCOME APPROXIMATION FUNCTION, SCHEMATIC DATA TRANSLATABLE INTO A PHYSICAL LAYOUT DESIGN FOR AN INTEGRATED CIRCUIT.

S3025 OUTPUTTING INSTRUCTIONS FOR MANUFACTURING THE INTEGRATED CIRCUIT BASED ON THE PHYSICAL LAYOUT DESIGN, WHEREIN THE INTEGRATED CIRCUIT IS ADAPTED TO: RECEIVE A SIGNAL REPRESENTING AN INPUT VALUE WITHIN THE PREDETERMINED INTERVAL AND PRODUCE AN OUTPUT SIGNAL REPRESENTING AN ESTIMATION OF THE TARGET FUNCTION AT THE INPUT VALUE ACCORDING TO THE OUTCOME APPROXIMATION FUNCTION.

FIG. 7

SYSTEM AND METHOD OF COMPUTING FUNCTIONS APPROXIMATION

FIELD OF THE INVENTION

The present invention relates generally to computing devices. More specifically, the present invention relates to systems and methods of computing approximation of mathematical functions.

BACKGROUND OF THE INVENTION

Function approximation is important in computing systems for efficiently representing complex functions with simpler polynomial, or rational expressions. This is useful in scenarios where computational resources are limited, such as embedded systems, real-time processing, and high-performance computing applications.

By approximating functions with polynomial, or rational representations, systems can perform faster calculations with reduced computational overhead, leading to improved performance and responsiveness. Additionally, function approximations enable the handling of functions that may not have closed-form solutions, facilitating numerical analysis, optimization, and simulation tasks across various scientific and engineering domains.

Minimax-based polynomial approximation methods aim to find a uniform approximation of a function of interest over a specified interval. The equioscillation property characterizes an optimal uniform approximation, where the error between the target function and the polynomial, or rational approximation, alternates between equal maximum positive and negative values at a specific number of points in the interval.

With current interpolation methods, large oscillations may appear near the edges of the interval—a behavior known as the Runge Phenomenon. These unwanted oscillations cause the approximation to deviate significantly from the true function, especially around the endpoints of the interval. There is a need for a process that would level the approximation error function, in a sense that the error would not exceed a uniformly distributed error level throughout the entire interval.

SUMMARY OF THE INVENTION

The present description and background are primarily focused on the non-limiting example of polynomial function approximations, where values of a target function f(x) may be approximated by a polynomial representation P(x), as known in the art.

For example, target function f(x) may include trigonometric functions such as sin(x) or tan(x). The respective polynomial representations P(x) may provide respective polynomials to approximate these functions, specifically:

$$Sin(x) \approx P(x) = x - (1/3!)x^3 + (1/5!)x^5 - (1/7!)x^7 \ldots$$

$$Tan(x) \approx P(x) = 1/3x^3 + 2/15x^5 + 17/315x^7 \ldots$$

As may be appreciated by a person skilled in the art, embodiments of the invention may also apply to alternative forms of function approximation, with the required adaptations. For example, embodiments of the invention may include, or relate to rational function approximations (e.g., Pade approximations), where values of a target function f(x) may be approximated by a quotient, which is a result of division between a dividend polynomial P(x), and a divisor polynomial Q(x), as known in the art. Pertaining to the example of f(x) trigonometric functions brought above, Sin(x) and Tan(x) may be approximated as follows:

$$Sin(x) \approx P(x)/Q(x), \text{ where } P(x) = -0.1167x^3 + x \ldots, \text{ and } Q(x) = 0.05x^2 + 1 \ldots$$

$$Tan(x) \approx P(x)/Q(x), \text{ where } P(x) = -0.06667x^3 + x \ldots, \text{ and } Q(x) = -0.4x^2 + 1 \ldots$$

Pertaining to the non-limiting example of polynomial approximation P(x): The Remez algorithm, also known as the Remez exchange algorithm, is a numerical method used for finding the best polynomial approximation to a given function over a specified interval.

The strength of the Remez algorithm lies in its ability to produce a polynomial P(x) that minimizes a maximal error over the entire interval, which is known as a minimax or Chebyshev approximation. This quality renders the Remez algorithm particularly useful in areas where optimal uniform approximation is required.

The main feature of the Remez algorithm is its iterative process, in which the polynomial approximation is iteratively refined. In each iteration (a) a polynomial is calculated using a current, reference set of points, (b) the current set of reference points is replaced with new points, where the error between the polynomial approximation and the target function is maximized, and (c) the polynomial approximation is refined in a subsequent iteration, using the new set of points.

The Remez algorithm may be summarized by the following stages:

Initialization: Starting with an initial set of points (typically Chebyshev nodes) in the interval where the approximation is sought;

Polynomial Construction: Solve for a polynomial and an error value F such that the error alternates between +ε and −ε at the reference points;

Error Analysis: Finding the points where the error between the function and the polynomial reaches its maximum absolute value across the interval. This involves locating all local extrema of the error function;

Point Exchange: Replacing at least one of the initial points with a point of maximum deviation, to form a new set of points; and Iteration: Repeating the process of constructing the polynomial, analyzing the error, and exchanging points until the maximum error is minimized, and meets a desired tolerance.

The Remez algorithm requires construction of the following linear system of equations:

$$\sum_{j=0}^{n} c_j x_i^j + (-1)^i \varepsilon = f(x_i) \qquad \text{Eq. 1}$$

where $x_i$ is the given reference set, $c_j$ and $\varepsilon$ are the unknowns, f is the function to be approximated. The value $\varepsilon$ will be referred to as the minimum deviation. The deviation term $\varepsilon$ represents the difference between the value of the polynomial approximation and the actual function value at specific points. The Remez algorithm seeks a polynomial P(x) that minimizes this maximal deviation across the interval.

Additionally, or alternatively, embodiments of the invention may approximate values of a target function f(x) as a rational function, e.g., a quotient which is a result of division between a dividend polynomial P(x), and a divisor polynomial Q(x). Pertaining to this non-limiting example, embodiments of the invention may construct a quotient of two polynomials as a best approximation to a function on a finite interval, characterized by similar oscillation properties, to solve a similar system of equations:

$$f(x_i) - \frac{\sum_{j=0}^{j=n} c_j x_i^j}{\sum_{j=0}^{j=m} d_j x_i^j} = (-1)^i \varepsilon \qquad \text{Eq. 2}$$

where $c_j$ are the unknown coefficients of the dividend polynomial $P(x)$, $d_j$ are the unknown coefficients of the divisor polynomial $Q(x)$, and $\varepsilon$ is the unknown deviation term.

The system of equations in Eq. 2 may not be linear, and its solution may not be unique. However, following methods known in the art, e.g., the Fraser and Hart method, may produce a pole-free solution in the range of the approximation.

According to some embodiments, the present invention may include a method of calculating an approximation of a target function over a predetermined interval. The method may include employing an approximation algorithm (e.g., a minimax-based Chebyshev algorithm such as the Remez algorithm) to calculate a first, or initial approximation function approximating the target function. The first approximation function may include (e.g., be defined by) a first, or initial set of coefficient values. An initial error function describing a difference between the target function and the first approximation function along the interval may be calculated. The method may further include identifying a set of characteristic (e.g., peak) points of the initial error function and receiving a requirement of a target accuracy for approximating the target function at the set of characteristic points.

Additionally, or alternatively, embodiments may include obtaining a set of coefficient constraints, defining desired properties of coefficients of an outcome approximation function. An objective function may be constructed based on the first approximation function and the set of coefficient constraints. Embodiments of the invention may minimize the objective function to find a first set of outcome coefficient values, that define the outcome approximation function and comply with the coefficient constraints, while the outcome approximation function satisfies the target accuracy requirement.

Embodiments of the invention may further include generating, based on the outcome approximation function, an approximation schematic representing an electrical approximation circuit. The electrical approximation circuit may be adapted to receive a signal representing an input value within the predetermined interval and produce an output signal representing an estimation of the mathematical function at the input value according to the outcome approximation function.

The approximation schematic may be adapted to be translated into a physical layout design, utilizable for fabricating an Integrated Circuit that includes the electrical approximation circuit.

In some aspects, the coefficient constraints may be selected from a list consisting of a representation of one or more coefficients, a precision of representation of one or more coefficients, and a rounding of one or more coefficients.

Embodiments of the invention may also include obtaining a set of polynomial power constraints defining properties of powers (e.g., $X^n$) of the outcome approximation function. The objective function may be constructed further based on the set of polynomial power constraints, and minimized such that powers of the outcome approximation function comply further with the set of polynomial power constraints.

In some embodiments, the polynomial power constraints may be selected from a list consisting of using only even power polynomials, using only odd power polynomials, and using only powers selected from a list of predetermined power values.

Embodiments of the invention may further include obtaining a set of error constraints defining a behaviour of a desired error function, which defines a difference between the target function and the outcome approximation function along the interval.

The objective function may be constructed further based on the set of error constraints and minimized such that the desired error function complies further with the set of error constraints.

In some aspects, the error constraints may be selected from a list consisting of requiring the desired error function to oscillate, requiring the desired error function to have sign-alternating peaks, and limiting an absolute value of the desired error function by a predetermined error level.

According to some embodiments, minimizing the objective function may include an iterative process, where each iteration may include perturbating a current set of coefficient values to find a new set of coefficient values that define an interim approximation function and comply with the coefficient constraints. An accuracy value of the interim approximation function over a predefined set of input points may be estimated. When the estimated accuracy satisfies the target accuracy requirement, the interim approximation function may be returned as a first version of the outcome approximation function. Otherwise, the iterative process may be repeated with the new set of coefficient values serving as the current set of coefficient values for a subsequent iteration.

In some implementations, the accuracy value is calculated as a combination of (i) an evaluation error, incurred due to computational precision in calculating the interim approximation function at the set of input points, and (ii) an approximation error incurred due to accuracy of the interim approximation function at the set of input points.

Embodiments of the invention may further include calculating an approximation error of the first outcome approximation function at the set of characteristic (e.g., peak) points, and employing the approximation algorithm, based on coefficients of the first outcome approximation function and the calculated approximation error, to produce a second version of the outcome approximation function. Embodiments of the invention may subsequently use the second version of the outcome approximation function to generate the approximation schematic, for fabricating the electrical approximation circuit.

In some aspects, the present invention may include a system for calculating an approximation of a target function over a predetermined interval. Embodiments of the system may include a non-transitory memory device where modules of instruction code are stored, and at least one processor associated with the memory device and configured to execute the modules of instruction code. Upon execution of the modules of instruction code, the at least one processor may be configured to perform operations similar to those described in the method above.

Additionally, the present invention may include a system for designing an integrated circuit adapted to calculate an approximation of a target function over a predetermined interval. Embodiments of the system may include a non-transitory memory device and at least one processor configured to perform operations similar to those described in the method above, with a focus on generating an approximation schematic representing an electrical approximation circuit based on the outcome approximation function.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5 is a flow diagram, depicting a method of generating an electrical circuit for computing approximation of mathematical functions, according to some embodiments of the invention;

FIG. 6 is a flow diagram, depicting a method of computing an approximation of a mathematical function by at least one processor, according to some embodiments of the invention; and FIG. 7 is a flow diagram, depicting a method of generating, by the at least one processor, instructions for manufacturing an electrical circuit for approximating a mathematical function, according to some embodiments of the invention.

Figure 1:
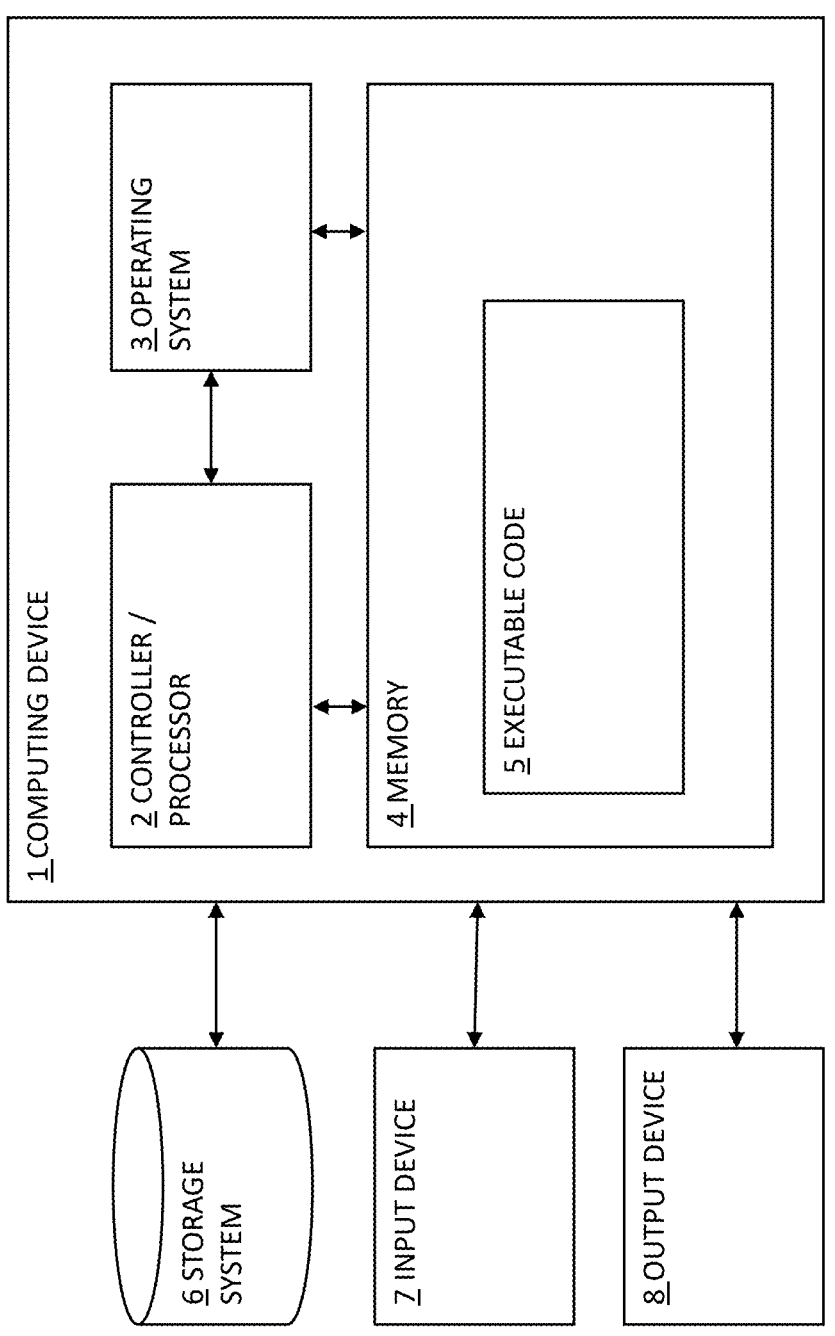
FIG. 1 is a block diagram, depicting a computing device which may be included in a system for approximation of mathematical functions according to some embodiments.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term "set" when used herein may include one or more items.

Unless explicitly stated, the method embodiments described herein are not constrained to a particular order or sequence. Additionally, some of the described method embodiments or elements thereof can occur or be performed simultaneously, at the same point in time, or concurrently.

Reference is now made to FIG. 1, which is a block diagram depicting a computing device, which may be included within an embodiment of a system for approximating mathematical functions, according to some embodiments.

Computing device 1 may include a processor or controller 2 that may be, for example, a central processing unit (CPU) processor, a chip or any suitable computing or computational device, an operating system 3, a memory 4, executable code 5, a storage system 6, input devices 7 and output devices 8. Processor 2 (or one or more controllers or processors, possibly across multiple units or devices) may be configured to carry out methods described herein, and/or to execute or act as the various modules, units, etc. More than one computing device 1 may be included in, and one or more computing devices 1 may act as the components of a system according to embodiments of the invention.

Operating system 3 may be or may include any code segment (e.g., one similar to executable code 5 described herein) designed and/or configured to perform tasks involving coordination, scheduling, arbitration, supervising, controlling or otherwise managing operation of computing device 1, for example, scheduling execution of software programs or tasks or enabling software programs or other modules or units to communicate. Operating system 3 may be a commercial operating system. It will be noted that an operating system 3 may be an optional component, e.g., in some embodiments, a system may include a computing device that does not require or include an operating system 3.

Memory 4 may be or may include, for example, a Random-Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 4 may be or may include a plurality of possibly different memory units. Memory 4 may be a computer or processor non-transitory readable medium, or a computer non-transitory storage medium, e.g., a RAM. In one embodiment, a non-transitory storage medium such as memory 4, a hard disk drive, another storage device, etc. may store instructions or code which when executed by a processor may cause the processor to carry out methods as described herein.

Executable code 5 may be any executable code, e.g., an application, a program, a process, task, or script. Executable code 5 may be executed by processor or controller 2 possibly under control of operating system 3.

For example, executable code 5 may be an application that may compute an approximation (polynomial approximation, rational approximation, and the like) of mathematical functions as further described herein.

Additionally, or alternatively, executable code 5 may include an application for designing, or configuring an electrical circuit, or a portion of an electrical circuit such as Integrated Circuit (IC) (e.g., an Application-Specific IC (ASIC), a Field-Programmable Gate Array (FPGA) device, a Coarse-Grained Reconfigurable Architecture (CGRA) device and the like), adapted to approximate mathematical functions, as elaborated herein.

Although, for the sake of clarity, a single item of executable code 5 is shown in FIG. 1, a system according to some embodiments of the invention may include a plurality of executable code segments similar to executable code 5 that may be loaded into memory 4 and cause processor 2 to carry out the methods described herein.

Storage system 6 may be or may include, for example, a flash memory as known in the art, a memory that is internal to, or embedded in, a micro controller or chip as known in the art, a hard disk drive, a CD-Recordable (CD-R) drive, a Blu-ray disk (BD), a universal serial bus (USB) device or other suitable removable and/or fixed storage unit. Data pertaining to mathematical functions of interest may be stored in storage system 6 and may be loaded from storage system 6 into memory 4 where it may be processed by processor or controller 2. In some embodiments, some of the components shown in FIG. 1 may be omitted. For example, memory 4 may be a non-volatile memory having the storage capacity of storage system 6. Accordingly, although shown as a separate component, storage system 6 may be embedded or included in memory 4.

Input devices 7 may be or may include any suitable input devices, components, or systems, e.g., a detachable keyboard or keypad, a mouse and the like. Output devices 8 may include one or more (possibly detachable) displays or monitors, speakers and/or any other suitable output devices. Any applicable input/output (I/O) devices may be connected to Computing device 1 as shown by blocks 7 and 8. For example, a wired or wireless network interface card (NIC), a universal serial bus (USB) device or external hard drive may be included in input devices 7 and/or output devices 8.

It will be recognized that any suitable number of input devices 7 and output device 8 may be operatively connected to Computing device 1 as shown by blocks 7 and 8.

A system according to some embodiments of the invention may include components such as, but not limited to, a plurality of central processing units (CPU) or any other suitable multi-purpose or specific processors or controllers (e.g., similar to element 2), a plurality of input units, a plurality of output units, a plurality of memory units, and a plurality of storage units.

Figure 2B:
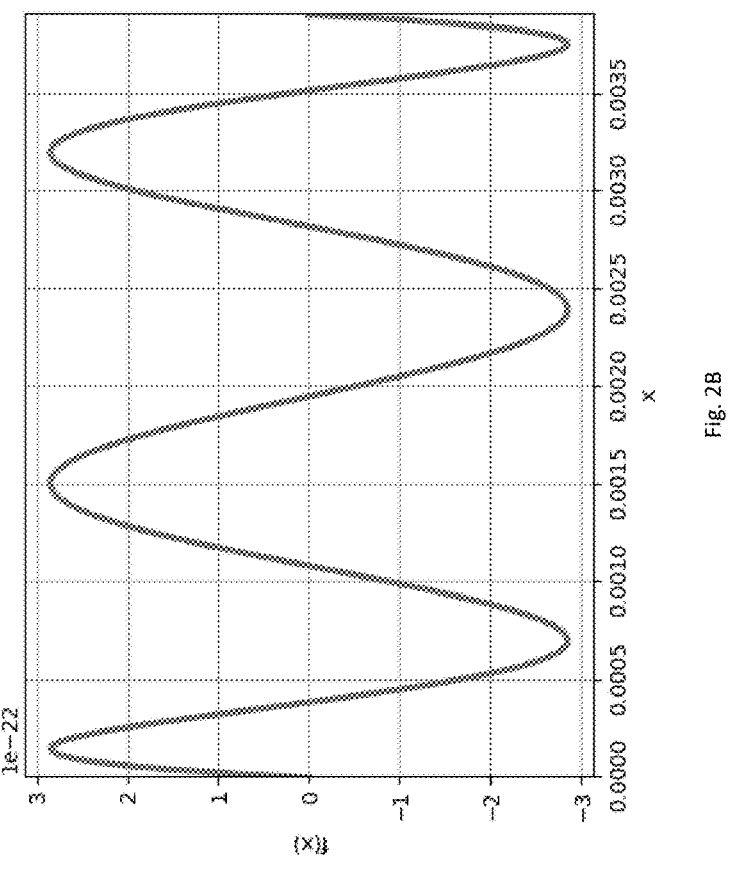
FIG. 2B is a graph showing behaviour of a second error function, representing a difference between values of a target function and corresponding values of a second polynomial approximation of that target function, obtained by embodiments of the present invention.
Figure 2A:
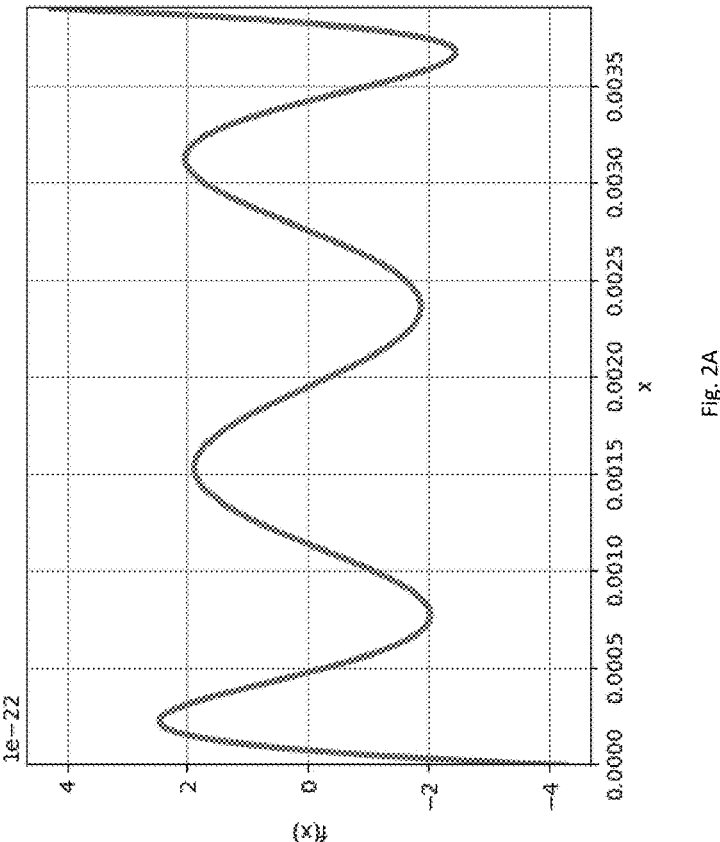
FIG. 2A is a graph showing behaviour of a first error function, representing a difference between values of a target function and corresponding values of a first, Remez-based polynomial approximation of that target function, as known in the art.

Reference is now made to FIGS. 2A and 2B. FIG. 2A is a graph showing the behaviour of a first error function, representing a difference between values of a target function and corresponding values of a first, Remez-based polynomial approximation of that target function, as known in the art.

As shown in FIG. 2A, the error of the first, Remez-based polynomial approximation, is characterized by an Equioscillation property, meaning that the error between the function and its best approximation polynomial oscillates above and below the function, where the magnitude of peak errors is substantially equal in amplitude, and alternating in sign.

As the degree of the interpolating polynomial increases, or approximating interval size decreases, significant oscillations appear near the edges of the interval. These oscillations result in large deviations from the actual function values, particularly at, or near the endpoints of the interpolation interval. This effect is particularly detrimental in applications that rely on approximating values of mathematical functions at borders, or extremities of predetermined intervals.

For example, when using double-precision logarithmic function approximation in a small interval of [0, 1/512] the error can reach 16489.99983724 ULPs (Units in Last Place). To deal with this error, one may try to increase the approximating polynomial degree. However, in such a small interval increasing the polynomial degree will lead to more oscillations.

The polynomial may oscillate wildly near the endpoints, reaching very large positive or negative values, far exceeding the range of the original function's data points. Hardware components processing the output of the polynomial evaluation must be able to handle this large dynamic range without saturation (clipping) or loss of precision for smaller values. This will incur more bits in data paths and components, increasing cost, complexity and consumption of computational resources.

For example, a polynomial approximation $$P_n(x) = \sum\nolimits_{i=0}^{n} a_i x_i$$

requires at least n multiplications and n additions (using Horner's method). A higher degree n or wider multipliers means more complex or more numerous Arithmetic Logic Units (ALUs), or longer computation time (latency) if done serially. This may increase power consumption and chip complexity and limit the system's throughput.

FIG. 2B is a graph showing behaviour of a second error function, representing a difference between values of a target function and corresponding values of a second polynomial approximation of that target function, obtained by embodiments of the present invention.

Embodiments of the invention may introduce additional constraints to the set of linear equations of Eq. 1, to arrive at improved properties of the error function. For example, Embodiments of the invention may limit the deviation of the polynomial approximation to a predetermined, fixed value, as an additional constraint in the process of the polynomial's calculation.

Embodiments of the invention may thus enforce constraints on the approximation algorithm (e.g., on minimax calculation), resulting in an error function whose boundaries are perfectly matched, or levelled. In other words, the polynomial approximation may oscillate around the target function, minimizing the maximal error within the interior of the interval, and may be substantially exact at selected points.

Therefore, and as shown in FIG. 2B, the produced error function will not spike at the interval's extremities, its peaks will not surpass the levelled error function, and it will still exhibit the equioscillation property, thereby bounding the error function within a maximal absolute value.

As elaborated herein, embodiments of the invention may generate an approximation of target function over the predetermined interval as part of a comprehensive optimization algorithm, in which various constraints, including constraints to the error function may be introduced.

In the example of FIG. 2B, after solving the optimization problem, the error was reduced to 0.00016276 ULPs of the previously known worst case and reducing the worst known error in the interval to the required threshold, while maintaining the same polynomial degree. This means that embodiments of the invention may implement improved polynomial approximation, without requiring excess hardware (e.g., larger multipliers). Additionally, the polynomial approximation's output and intermediate calculation values stay within a much tighter, predictable range.

When using fixed-point arithmetic, embodiments of the invention may significantly reduce the required bit-width for fixed-point representation (both integer and fractional parts), without incurring extreme value swings. This makes fixed-point arithmetic practical, drastically lowering chip area, power consumption, and complexity compared to floating-point or very high-precision fixed-point needed for the oscillating polynomial.

Embodiments of the invention may also reduce the risk of overflow or underflow. Even when using floating-point arithmetic, the reduced sensitivity means that inherent representation errors will not be amplified dramatically, making calculations more stable and less prone to catastrophic cancellation or other numerical pitfalls.

Embodiments of the invention may greatly simplify the process of designing test vectors, and verifying hardware implementation. Expected output ranges may be well-defined, and corner cases related to extreme oscillations may be eliminated, reducing verification effort and time-to-market.

Trading Runge's endpoint oscillations for a slightly increased level error may translate into significant hardware benefits. From a hardware perspective, predictable, bounded error (even if slightly higher on average) is almost always preferable to unpredictable, potentially unbounded error concentrated in certain regions. Embodiments of the invention may thus lead to designs that are typically smaller, cheaper, lower in power consumption, more reliable, and easier to design and test.

As known in the art, complexity (and thus Silicon area) of multipliers grows roughly quadratically with the mantissa width (e.g., $O(N^2)$ for N-bit mantissa in basic designs). Adders also scale significantly due to alignment shifters and normalization logic. Embodiments of the invention may seek optimal rational or polynomial approximation of the target function while applying constraints on polynomial coefficients. For example, by moving from 64-bit precision to 53-bit precision, embodiments of the invention may shrink silicon area by a factor of roughly 2.5× to 4× and reduce the number of arithmetic operations by as much as 50%.

Figure 3:
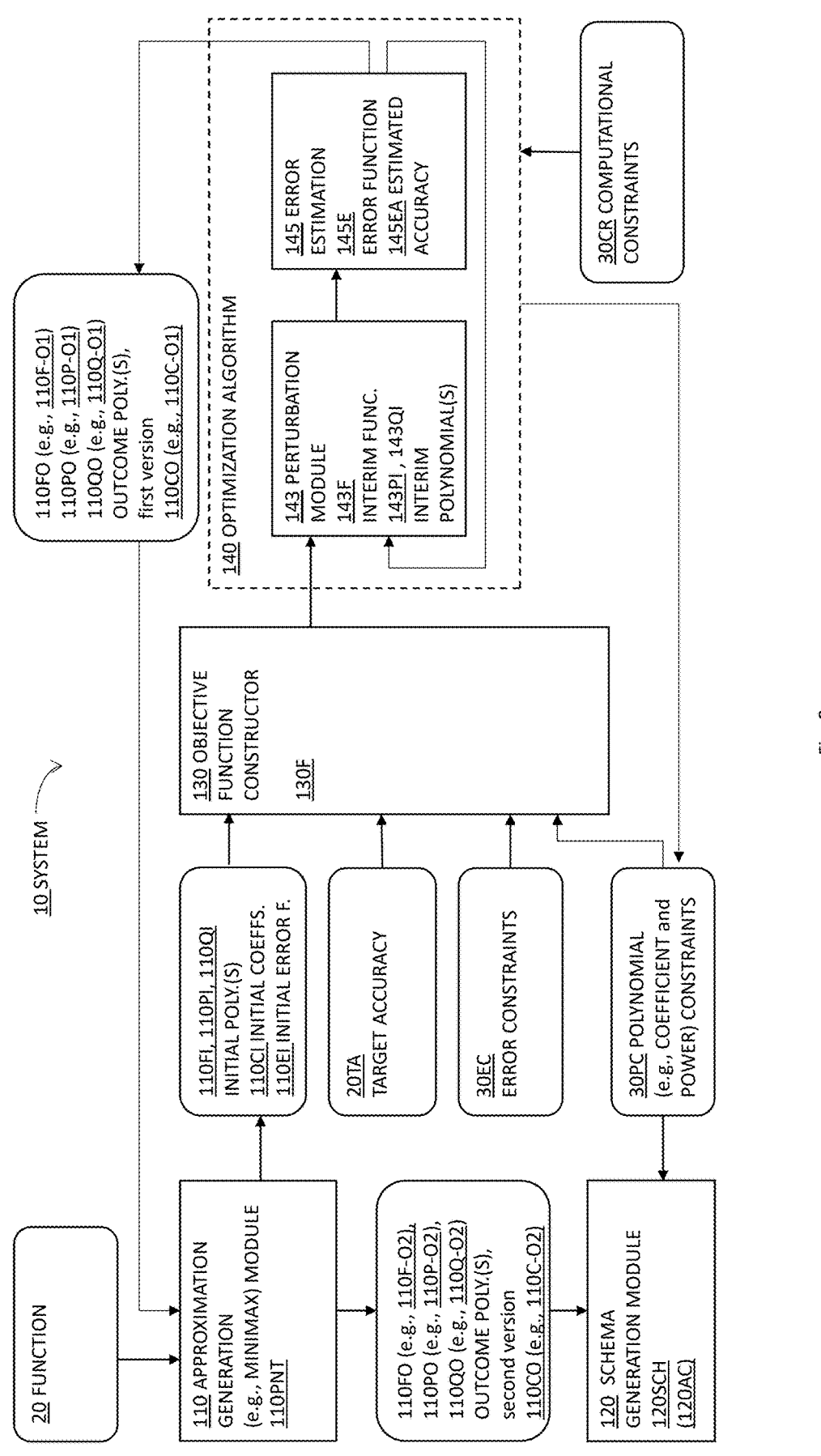
FIG. 3 is a block diagram, depicting a system for approximation of mathematical functions, according to some embodiments of the invention.

Reference is now made to FIG. 3, which depicts a system 10 for approximating mathematical functions, according to some embodiments of the invention. System 10 may be implemented as a software module, a hardware module, or any combination thereof.

For example, system 10 may be or may include a computing device such as element 1 of FIG. 1, and may be adapted to execute one or more modules of executable code (e.g., element 5 of FIG. 1) to compute approximation of mathematical functions, as further described herein.

As shown in FIG. 3, arrows may represent flow of one or more data elements to and from system 10 and/or among modules or elements of system 10. Some arrows have been omitted in FIG. 3 for the purpose of clarity.

As shown in FIG. 3, system 10 may receive, e.g., from input 7 of FIG. 1, a definition 20 of a target mathematical function, over a predetermined interval. System 10 may include several interconnected components, designed to calculate an approximation (e.g., polynomial approximation, rational approximation) of target mathematical function 20 over the predetermined interval, as explained herein.

According to some embodiments, system 10 may employ an approximation algorithm module (also referred to herein as an approximation generation module) 110, to calculate an initial approximation function 110F. For example, approximation algorithm module 110 may implement a minimax-based approximation algorithm 110 such as the Remez algorithm, or the Chebyshev polynomial approximation algorithm, to calculate approximation function 110F as a first polynomial approximation 110PI. Additionally, or alternatively, approximation algorithm module 110 may be configured to calculate initial approximation function 110F as a rational approximation, defined as a quotient of an initial dividend polynomial 110PI and an initial divisor polynomial 110QI.

Polynomials 110PI and/or 110QI may include (e.g., may be defined by) a first (e.g., an initial) set of coefficient values 110CI. Polynomials 110PI and/or 110QI may be adapted to approximate target mathematical function 20.

As known in the art, minimax-based approximation algorithms (e.g., Chebyshev) may perform an iterative process to construct polynomial or rational approximations of a given function. In the context of the present invention, approximation generation module 110 may employ an approximation algorithm (e.g., the Remez algorithm) to generate polynomials 110PI and/or 110QI, that minimize a maximum approximation error (hence—minimax) of the target mathematical function over the predetermined interval. It may be appreciated that other metrics (other than minimax, e.g., Route Mean Square (RMS)) for evaluating polynomial and/or rational approximation functions may also be used, with appropriate modifications.

Pertaining to the example of minimax-based evaluation: approximation algorithm (or module, used interchangeably) 110 may start with an initial set of characteristic points along the predetermined interval. In each iteration, the approximation algorithm 110 may construct an interim (e.g., pertaining to that iteration) version of polynomials 110PI and/or 110QI that fit function 20 at these points, and calculate an error function 110EI which represents a difference between function 20 and the initial, or interim approximation function 110FI (110PI and/or 110QI), as depicted in the examples of FIGS. 2A and 2B. Approximation algorithm 110 may then iteratively refine approximation function 110FI (e.g., polynomials 110PI and/or 110QI) by replacing the initial set of points with new points, where the calculated error 110EI is significant.

For example, when using minimax metrics, approximation module 110 may identify one or more (e.g., a set of) characteristic points that are peak points of the initial error function 110EI.

As elaborated herein, the set of characteristic (e.g., peak) points of the initial error function 110EI, and the initial set of coefficient values 110CI of polynomials 110PI and/or 110QI may serve as a starting point for further optimization, in an effort to produce an optimized outcome approximation function 110FO.

Outcome approximation function 110FO may be defined by outcome polynomials 110PO and/or 110QO, which in turn may have, or be defined by respective sets of outcome coefficient values 110CO, as elaborated herein (e.g., in relation to Eqs. 1 and 2).

For example, outcome approximation function 110FO may be a polynomial function, which may be equal to outcome polynomial 110PO. Additionally, or alternatively, outcome approximation function 110FO may be a rational function, which may be defined as a quotient of outcome polynomials 110PO and 110QO.

According to some embodiments, system 10 may receive a requirement of a target accuracy 20TA for approximating target function 20 at the set of peak points. For example, target accuracy requirement 20TA may dictate that error function 110EI (and subsequently 145E) should not surpass a predetermined target value. Outcome polynomial(s) 110PO and/or 110QO may be optimized in a sense that they may define outcome approximation function 110FO so as to satisfy the desired target accuracy 20TA for approximation of target function 20.

Additionally, or alternatively, outcome polynomial 110PO may be optimized in a sense that error function 110EI may be levelled (e.g., not peak, or surpass) the predefined threshold level at the interval's extremities.

Additionally, or alternatively, system 10 may obtain a set of constraints 30PC, defining desired properties of coefficients and/or polynomial powers of outcome polynomial 110PO. Outcome polynomial 110PO may be optimized in a sense that it may comply with the predefined polynomial constraints 30PC, pertaining to its coefficient values and polynomial power values. In other words, outcome polynomial 110PO may include constrained values of its coefficients and polynomial powers. As explained herein, these constraints may be selected so as to utilize computing resources (e.g., memory consumption and computing cycles) in an efficient, and economic manner.

As shown in the non-limiting example of FIG. 3, system 10 may include an objective function construction module 130, adapted to construct an objective function 130F.

As known in the art, the term "objective function" may refer to a mathematical function that may be optimized (e.g., maximized or minimized) during an iterative optimization process or algorithm 140, to obtain a predetermined objective, given predefined constraints.

In the context of function approximation, in each iteration, objective function 130F may measure an error or deviation 145E between target function 20 and an interim (e.g., pertaining to that iteration) approximation 143PI of target function 20. The optimization process may adjust coefficients of the polynomial (polynomial approximation 143PI) in such a way that the objective function is minimized, thereby achieving the best possible approximation of the target function, while meeting desired criteria and constraints, as elaborated herein.

According to some embodiments, module 130 may construct objective function 130F, based on (a) polynomials 110PI and/or 110QI (e.g., using coefficients 110CI of polynomial 110P/110QI as a starting point for optimization), and (b) a set of constraints, such as polynomial constraints (e.g., coefficient constraints, polynomial power constraints) 30PC, error constraints 30E, and computational resource constraints 30CR.

Additionally, or alternatively, module 130 may construct objective function 130F by defining constraints that must be held and assigning a penalty for each constraint (e.g., constraints 30PC, 30E, 30CR) that is violated.

Optimization algorithm 140 may then optimize (e.g., minimize) objective function 130F, to find a set of coefficient values 110C-O1 of a first version of outcome polynomials 110PO (denoted 110P-O1) and/or 110QO (denoted 110Q-O1).

Optimization algorithm 140 may be, or may include an appropriate iterative optimization process as known in the art.

For example, optimization algorithm 140 may be, or may use a gradient-oriented heuristic algorithm (e.g., gradient descent). As known in the art, such gradient-oriented heuristic algorithms may combine gradient information with heuristic strategies to guide the search toward optimal or near-optimal solutions in complex or non-convex landscapes. In the context of the present invention, optimization algorithm 140 may use such gradient-oriented optimization algorithms to optimize objective function 130F. In other words, optimization algorithm 140 may use gradient-oriented optimization algorithms to find outcome polynomials (110P-O1/110Q-O1) that approximate target function 20, and are optimal in a sense that they best accommodate predetermined constraints (30EC/30PC/30CR).

In another example, optimization algorithm 140 may be, or may include a simulated annealing process. As known in the art, simulated annealing may be used to find a good approximation to the global optimum of a function in a large or complex search space, when the function has many local optima. In the context of the present invention, optimization algorithm 140 may seek a good approximation to a global optimum of objective function 130F, thereby obtaining globally optimal outcome polynomials (110P-O1/110Q-O1).

In another example, optimization algorithm 140 may be, or may include a stochastic algorithm, such as the Monte Carlo algorithm. As known in the art, such stochastic algorithms are computational techniques that may use randomness to solve problems that might be deterministic in principle, but are complex for exact solutions. These algorithms rely on repeated random sampling to estimate numerical results, making them useful where analytical solutions are infeasible. In the context of the present invention, optimization algorithm 140 may use a stochastic algorithm such as Monte Carlo to optimize objective function 130F (i.e., find optimal outcome polynomials (110P-O1/110Q-O1)).

In yet another example, optimization algorithm 140 may apply the Metropolis-Hastings (MH) algorithm on objective function 130F. As known in the art, MH is a stochastic sampling method that generates a sequence of samples from a probability distribution by proposing random moves, and accepting them based on underlying values of the objective function. This allows exploration of complex or unknown distributions of that objective function. In the context of the present invention, optimization algorithm 140 may explore objective function 130, in effort of reaching optimal outcome polynomials (110P-O1/110Q-O1)). Other combinations of appropriate optimization algorithms 140 may also be possible.

Optimization process or algorithm 140 may iteratively search for a solution that minimizes a combined weighted cost. This cost may be a weighted combination of penalty values, incurred by each of the predetermined constraints 30PC, 30EC, 30CR.

Some constraints (30PC/30EC/30CR) may be defined as critical. For example, an error constraint 30EC that requires preserving the equioscillation property may be assigned a higher penalty value, or be attributed higher weight in the weighted combination of all penalties.

As explained herein, optimization process or algorithm 140 may be an iterative one. In each iteration, a function perturbation module 143 may change, or perturb a current set (e.g., pertaining to the current iteration) of coefficient values 110C-O1, to find a new set of coefficient values 110C-O1. The new set of coefficient values 110C-O1 may comply with the polynomial (e.g., coefficient) constraints 30PC, and may define interim polynomials 143PI, 143QI.

Interim polynomials 143PI, 143QI may in turn define interim approximation function 143FI. For example, interim approximation function 143FI may be a polynomial function, which may be equal to Interim polynomials 143PI. Additionally, or alternatively, interim approximation function 143FI may be a rational function, which may be defined as a quotient of interim polynomials 143PI, 143QI.

Error estimation module 145 may estimate an accuracy value 145EA, representing accuracy of the interim approximation function 143FI over a predefined set of input points along the predefined interval.

For example, accuracy value 145EA may represent a combination of (i) an evaluation error, due to limited precision of computing the polynomial or rational approximation, of the interim approximation function 143FI at the set of input points, and an (ii) an approximation error (e.g., representing a difference between the mathematical function 20 and the interim approximation function 143FI) at the set of input points.

According to some embodiments, when estimated accuracy 145EA satisfies the target accuracy requirement 20TA, optimization module 140 may return interim polynomials 143PI and/or 143QI of interim function 143FI as a first version of outcome polynomials 110PO (denoted 110P-O1) and/or 110QO (denoted 110Q-O1) of outcome function 110FO. Otherwise, the iterative process 140 may repeat, e.g., using the new set of coefficient values as the current set of coefficient values for the subsequent iteration.

It may be appreciated by a person skilled in the art that a theoretical, optimal error function 145E should have equal extrema values. However, computations always have finite precision, the magnitudes of extrema will typically not be exactly equal. Optimization module 140 may calculate a perturbation value that may be required for the polynomial coefficients, in order to achieve an error function 145E which is characterized by perfectly equal extrema values. According to some embodiments, if this perturbation value is smaller than the working precision, then optimization module 140 may determine the current polynomial solution of coefficient values to be good enough.

Additionally, or alternatively, optimization module 140 may employ a combination of one or more approaches in order to seek a global solution, rather than a local one.

For example, optimization module 140 may continue to employ iterative process 140 for at least a predetermined number of iterations, until no changes are made to the coefficient values.

In another example, optimization module 140 may start from different points in the coefficient space, in effort to converge to the same (e.g., closely similar) polynomial solution of coefficient values.

As explained herein, the iterative optimization process 140 may produce the initial set of coefficient values 110C-O1 that define the first version of outcome function 110FO (e.g., via output polynomials 110PO (110P-O1) and 110QO (110Q-O1)), and comply with polynomial constraints 30PC (e.g., coefficient constraints, polynomial power constraints), as elaborated herein.

Outcome function 110FO (e.g., defined by 110P-O1 and/or 110Q-O1) may, in turn, be adapted to satisfy requirements for target accuracy 20TA, and may also comply with various types of constraints.

For example, outcome function 110FO may comply further with error constraints 30E in a sense that behaviour of error function 145E (e.g., the difference between outcome function 110FO and target function 20) may comply further with the set of error constraints 30E (e.g., in addition to polynomial constraints 30PC), as elaborated herein.

Additionally, or alternatively, polynomial powers of outcome polynomials 110PO/110QO (e.g., 110P-O1 and/or 110Q-O1), which define function 110FO (e.g., 110F-O1), may comply further with polynomial power constraints 30PC, as elaborated herein.

As elaborated herein, constraints 30E may include, for example, ones that relate to behaviour of the outcome function's 110FO error function 145E (e.g., a difference between function 110FO (e.g., 110F-O1) and target function 20), and may be referred to herein as "error constraints 30EC".

Additionally, or alternatively, constraints 30E may include ones that relate to properties of outcome polynomials 110PO (e.g., 110P-O1) and/or 110QO (e.g., 110Q-O1) themselves, and may thus be referred to as "polynomial constraints 30PC". Polynomial constraints 30PC may include, for example, constraints over properties of polynomial's 110PO/110QO coefficients, and constraints over properties of polynomial's 110PO/110QO powers.

As explained herein, embodiments of the invention may include a method of designing, or configuring an electrical circuit (e.g., an IC, such as an ASIC, FPGA CGRA and the like), or a portion thereof, adapted to compute polynomial approximation of mathematical functions.

For example, system 10 may include a schematic generation module 120, adapted to generate a schematic 120SCH based on the outcome polynomials 110PO and/or 110QO. In other words, schematic 120SCH may represent a hardware-based electrical circuit ("approximation circuit" 120AC), that is configured to perform approximation of target function 20, based on outcome polynomials 110PO and/or 110QO.

The outcome polynomial schematic 120SCH may be translatable, or adapted to be translated by at least one computing device (e.g., device 1 of FIG. 1) into a physical layout design. The physical layout design may be utilizable for fabricating an IC that may include the approximation electrical circuit 120AC.

Figure 4:
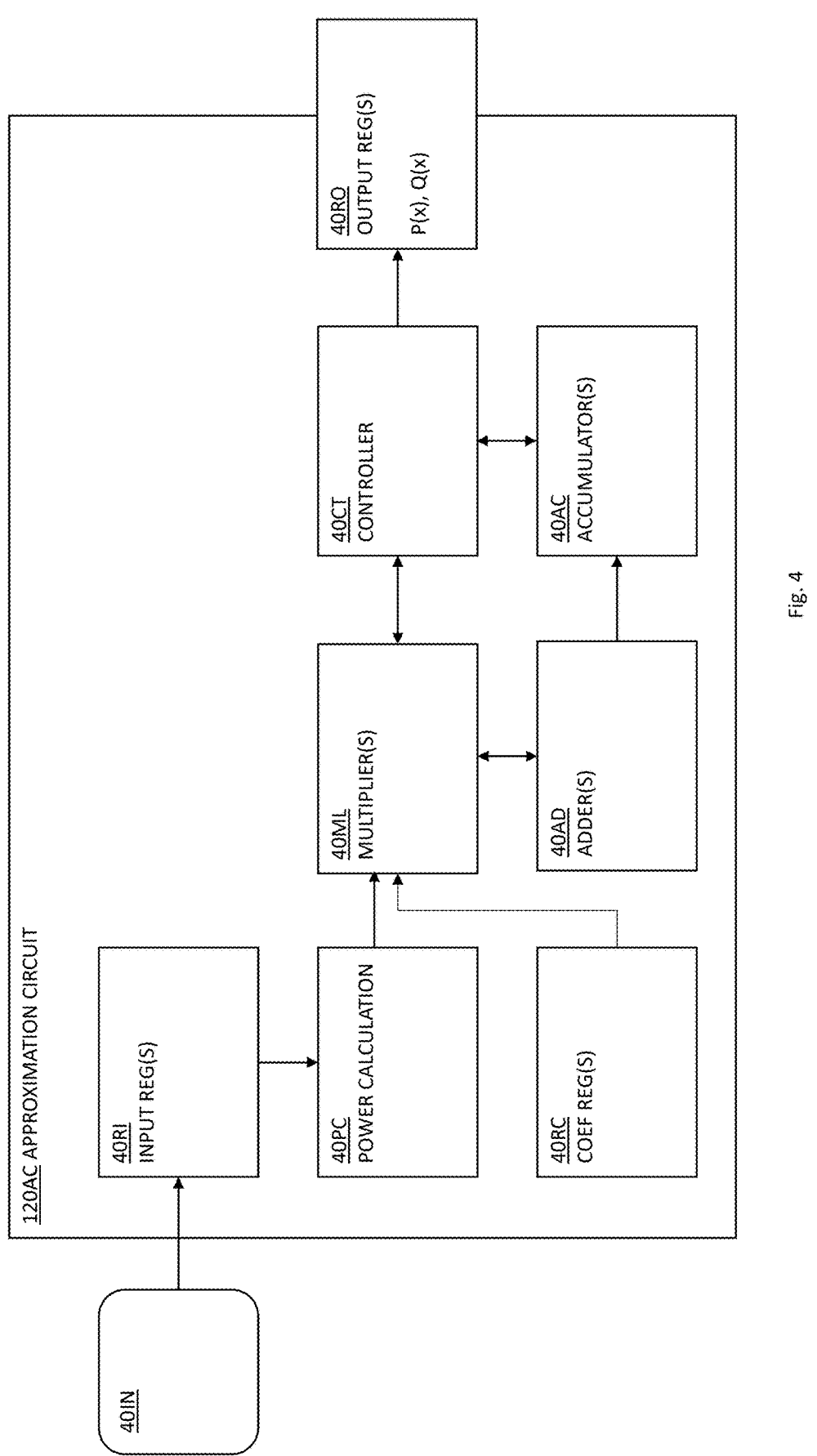
FIG. 4 is a schematic block diagram, depicting an example of implementation of an approximation electrical circuit 120AC, that may be designed, or produced according to some embodiments of the invention.

Reference is also made to FIG. 4, which is a schematic block diagram, depicting an example of implementation of an approximation electrical circuit 120AC, that may be designed, or produced according to some embodiments of the invention.

When implemented as an electrical circuit (e.g., as part of an IC), approximation circuit 120AC may be adapted to receive an input signal, representing a value within the predetermined interval, and produce an output signal representing estimation of the mathematical function 20 at the input value, according to the outcome polynomials 110PO/110QO of outcome function 110FO.

According to some embodiments, approximation calculation electrical circuit 120AC may be designed to compute the output of a polynomial given an input value 40IN. The circuit may include several components, including an input register 40RI, coefficient registers 40RC, one or more multipliers 40ML, one or more adders 40AD, one or more power calculation units 40PC, at least one accumulator 40AC, a control unit 40CT, and an output register 40RO.

Input register(s) 40RI may hold the input value x 40IN, while the coefficient registers may store polynomial coefficients $c_0, c_1, c_2 \ldots, c_n$ of polynomials 110PO/110QO. Power calculation units 40PC may generate the necessary powers of x, such as x, $x^2$, $x^3$, $\ldots$, $x^n$, which may then be fed into multipliers 40ML.

Multipliers 40ML may compute the terms $c_i x^i$ for each coefficient $c_i$ and corresponding power $x^i$. These terms may then be summed by one or more adders 4-AD to combine the results. Accumulator 40AC may sequentially add the products of the multipliers, starting with the constant term $c_0$ and adding each subsequent term to produce the final polynomial values P(x) and/or Q(x).

Multipliers 40ML and adders 4-AD may be used to evaluate the polynomials P(x) and/or Q(x). The computation of the polynomial may, for example, be in Horner's form, or in another form as known in the art, according to the optimized polynomial structure.

Control unit 40CT may manage the sequence of operations, e.g., to ensure the correct order of these operations. The computed polynomial value(s) P(x) and/or Q(x) may be stored in the output register 40RO, ready for further processing or output.

When calculating a polynomial approximation, the output of polynomial P(x) may be provided as the computed approximation of mathematical function 20 at input x 40IN. Additionally, or alternatively, when calculating a rational approximation, the quotient of polynomial values P(x) and Q(x) may be provided as the computed approximation of mathematical function 20 at input x 40IN.

As explained herein, the target accuracy 20TP parameter may define the required accuracy for approximating the target function at the error function's 145E set of characteristic (e.g., peak) points. In other words, target accuracy 20TP may be understood as a parameter that guides optimization process 140 to ensure that outcome function 110FO (e.g., 110PO) meets the desired accuracy.

The set of error constraints 30EC may define the behavior of the desired error function 145E, which represents the difference between the target function 20 and the outcome approximation function 110FO (e.g., 110PO) along the interval. Error constraints 30EC may be understood as depicted in FIG. 2B.

For example, error constraints 30EC may include a requirement for oscillation of error function 145E throughout the predefined interval. In another example, error constraints 30EC may include a requirement for having sign-alternating peaks. In another example, error constraints 30EC may include a limitation of the value of the error function 145E by a predetermined error level. In yet another example, error constraints 30EC may include a limitation of the value of the error function 145E to be small (e.g., substantially nullified), or below a predetermined threshold at the extremities of the interval.

The set of polynomial constraints 30PC may define desired properties of coefficients and/or polynomial powers of outcome polynomials 110PO/110Q.

For example, polynomial constraints 30PC may include a definition of representation of one or more coefficients, e.g., as fixed-point representation, scaled fixed-point representation, floating point representation, and the like.

In another example, polynomial constraints 30PC may define a precision (e.g., a single precision, a double precision, and the like) of representation of one or more coefficients.

In another example, polynomial constraints 30PC may determine rounding of one or more coefficient values, e.g., to be presented as a combination of one or more power of 2.

In another example, polynomial constraints 30PC may determine a degree of outcome polynomials 110PO and/or 110QO.

In another example, polynomial constraints 30PC may limit outcome polynomials 110PO and/or 110QO to include, or use only even power polynomials (e.g., $X^2$, $X^4$ . . . ), or only odd power polynomials (e.g., $X^1$, $X^3$, $X^5$ . . . ).

In yet another example, polynomial constraints 30PC may limit outcome polynomials 110PO and/or 110QO to use powers (e.g., $X^0$, $X^1$, $X^4$, $X^8$) of a list of predetermined power values (e.g., 0, 1, 4, 8).

It may be appreciated that each of the polynomial constraints 30PC may ultimately affect consumption of software and/or hardware resources, such as the number of required multipliers, a required hardware (e.g., silicon) area, a compute graph size, a computing latency, a maximal clock frequency, data throughput and computing cycles. As explained herein, embodiments of the invention may facilitate implementation of mathematical approximations, while taking polynomial constraints 30PC and/or error constraints 30EC into account. Therefore, embodiments of the invention may provide a practical application in the field of circuit and chip design, allowing practitioners a degree of freedom for optimizing their design in view of predefined computational resources, and accuracy requirements.

According to some embodiments, optimization module 140 may collaborate with schema generation module 120, to determine polynomial constraints 30PC. For example, optimization module 140 may receive one or more definitions of computational constraints 30CR which may define limitations for computational resource consumption of approximation circuit 120AC. Computational constraints 30CR may, for example, define a limitation for silicon area, power consumption, latency, computing cycles, that may be consumed by approximation circuit 120AC for calculating approximation of target function 20.

Optimization module 140 may collaborate with schema generation module 120 to assess further compliance of approximation circuit 120A with computational constraints 30CR (e.g., in addition to polynomial constraints 30PC, and/or error constraints 30EC). When such compliance is not achieved, optimization module 140 may modify polynomial constraints 30PC (e.g., coefficient constraint and/or polynomial power constraints) in an iterative process, until computational constraints 30CR are met. Such iterative process may include gradual, iterative limitation of the outcome polynomials' 110PO and/or 110QO powers, by iterative changing of polynomials' precision, iterative modification of coefficient representation, and the like.

According to some embodiments, optimization module 140 may calculate error function 145E which represents a difference between the target function 20 and the first version 110F-O1 of outcome approximation function 110FO, along the predetermined interval.

Optimization module 140 may proceed to identify a set of characteristic (e.g., peak) points of error function 145E, and calculate an approximation error of outcome approximation function 110F-O1 at the set of characteristic (e.g., peak) points.

Optimization module 140 may then transfer (i) the coefficients 110C-O1 of the first outcome polynomial(s) 110P-O1/110Q-O1, and (ii) the calculated approximation error at the set of characteristic points, to approximation generation module 110.

System 10 may thus reuse the approximation algorithm of approximation generation module 110, to produce a second version (denoted 110P-O2/110Q-2) of outcome polynomials 110PO and/or 110QO, based on (i) the coefficients of the first outcome polynomials 110P-O1/110Q-1, and (ii) the calculated approximation error 145E.

The second version (110P-O2/110Q-2) of outcome polynomials 110PO and/or 110QO may define a second version (110F-O2) of outcome approximation function 110FO.

For example, when outcome approximation function 110FO is a polynomial approximation function, 110F-O2 may be equal to the second version (110P-O2) of outcome polynomial 110PO. Additionally, or alternatively, when outcome approximation function 110FO is a rational approximation function, 110F-O2 may be equal to a quotient of (i) the second version (110P-O2) of outcome polynomial 110PO, and (ii) the second version (110Q-O2) of outcome polynomial 110QO.

It may be appreciated that by feeding (i) coefficients 110C-O1 of the first outcome polynomial(s) (110P-O1/110Q-O1) and (ii) the approximation error values at the set of characteristic (e.g., peak) points back to approximation generation module 110, embodiments of the invention may restart the search for the polynomial approximation (e.g., for the second version (110P-O2/110Q-2) of the outcome polynomials) at a position which is globally optimal in a sense that it minimizes the objective function 130F. In other words, embodiments of the invention may thus employ a dual-stage optimization process, to arrive at an optimal, accurate polynomial approximation, while avoiding local minima solutions.

Reference is now made to FIG. 5, which is a flow diagram, depicting a method of generating, by at least one processor (e.g., processor 2 of FIG. 1), an electrical circuit (e.g., approximation circuit 120AC), for computing approximation of a mathematical function (e.g., 20 of FIG. 2), according to some embodiments of the invention.

As shown in step S1005, processor 2 may employ an approximation algorithm (e.g., 110 of FIG. 2), such as the Remez algorithm, or the minimax-based Chebyshev polynomial approximation algorithm, to calculate a first approximation function (e.g., 110F of FIG. 3). The first approximation function 110F may approximate the target function 20, and may comprise (e.g., be defined by) an initial, or first set of coefficient values.

As shown in step S1010, processor 2 may calculate an initial error function (e.g., 110EI of FIG. 3), describing a difference between the target function 20 and the first approximation function 110F along the interval. Processor 2 may identify (step S1015) a set of characteristic (e.g., peak)

points of the initial error function 110EI, as discussed herein (e.g., in relation to FIGS. 2A and 2B).

As shown in step S1020, processor 2 may receive a requirement of a target accuracy (e.g., 20TA of FIG. 3) for approximating the target function 20 at the set of characteristic points.

In step S1025, processor 2 may obtain a set of coefficient constraints (e.g., 30PC of FIG. 3), defining desired properties of coefficients of a desired, outcome approximation function (e.g., 110FO of FIG. 3).

As elaborated herein (step S1030), processor 2 may construct an objective function (e.g., 130F of FIG. 3) based on the first approximation function 110F and the set of coefficient constraints. Processor 2 may minimize (step S1035) the objective function, to find a first set (e.g., 110CO-1 of FIG. 3) of outcome coefficient values 110CO. As elaborated herein, these outcome coefficient values 110CO (110CO-1) may define the outcome approximation function 110FO, and be compliant with the coefficient constraints 30PC, while outcome approximation function 110F may satisfy the target accuracy requirement 20TA.

As shown in step S1040, processor 2 may generate, based on the outcome approximation function 110FO (e.g., based on coefficient values 110CO), an approximation schematic (e.g., 120SCH of FIG. 3), representing an electrical approximation circuit (e.g., 120AC of FIGS. 3, 4).

Electrical approximation circuit 120AC may be adapted to receive a signal (e.g., 40IN of FIG. 4) representing an input value within the predetermined interval, and produce an output signal (e.g., 40RO of FIG. 4). Output signal 40RO may represent an estimation of the mathematical function 20 at the input value 40IN, according to the outcome approximation function 110FO.

Reference is now made to FIG. 6, which is a flow diagram, depicting a method of computing an approximation of a mathematical function by at least one processor (e.g., processor 2 of FIG. 1).

Steps S2005-S2035 of FIG. 6 may be respectively identical to steps S1005-S1035 of FIG. 5, and their description will not be repeated here for the sake of brevity.

In step S2040, the at least one tabtcome approximation function, to execute an instruction of an instruction set in software or hardware.

For example, processor 2 may be associated with one or more non-transitory memory devices (e.g., memory 4 of FIG. 1). In some embodiments, processor 2 may be configured to store the outcome approximation function 110FO on memory device(s) 4. Additionally, or alternatively, memory devices 4 may store instruction code, or instruction sets that include using or calculating target function f(x) (e.g., target function 20 of FIG. 3). The at least one processor 2 may execute the modules of instruction code (e.g., calculate outcome of function f(x) for a given input value x) by reading the stored outcome approximation function 110FO, and using 110FO to promptly produce an approximation of the required result in a rapid and accurate manner.

Additionally, or alternatively, processor 2 may be associated with, or communicatively connected to an electrical approximation circuit (e.g., approximation circuit 120AC of FIG. 4). Upon execution of the instruction code, stored on memory device(s) 4, processor 2 may be required to calculate an output value of target function f(x) 20, given an input value of x. Processor 2 may provide the input value x (e.g., input value 40IN of FIG. 4) to approximation circuit 120AC, and thereby use approximation circuit 120AC to approximate of target function f(x) at point x (40IN).

Reference is now made to FIG. 7, which is a flow diagram, depicting a method of generating, by the at least one processor, instructions for manufacturing an electrical circuit for approximating a mathematical function (e.g., processor 2 of FIG. 1), according to some embodiments of the invention.

In step S3005, the at least one processor 2 may employ an approximation generation module (e.g., 110 of FIG. 3) to generate an initial approximation function (e.g., 110FI of FIG. 3), such as a polynomial approximation function (110PI, defined by coefficients 110CI) and/or a rational approximation function (110PI, 110QI, defined by coefficients 110CI), that approximates the target function (e.g., 20 of FIG. 3) over the predetermined interval.

In step S3010, the at least one processor 2 may employ an objective function constructor module (e.g., 130 of FIG. 3), to construct an objective function (e.g., 130F of FIG. 3) based on the initial approximation function 110FI. As explained herein, objective function 130F may be configured to control error distribution at the predetermined interval's boundaries.

For example, objective function constructor 130 may receive initial coefficients 110CI, and error constraints 30EC, which may define one or more requirements regarding error and/or accuracy of a desired approximation function. objective function constructor 130 may utilize this input to produce an objective function 130F which, upon optimization, will produce optimal output approximations (110P-O1/110Q-O1), as explained herein.

In step S3015, the at least one processor 2 may perform an iterative optimization process (e.g., 140 of FIG. 3) on objective function 130 to find a set of outcome coefficient values that define an outcome approximation function (110P-O1/110Q-O1). The outcome approximation function (110P-O1/110Q-O1) may approximate the target function 20 and may be optimized in a sense that it may best satisfy one or more predetermined constraints (e.g., 30PC/30CR/30EC of FIG. 3). For example, approximation function (110P-O1/110Q-O1) may best satisfy one or more predetermined error constraints (e.g., an accuracy requirement) in approximating the target function 20. Additionally, or alternatively, approximation function (110P-O1/110Q-O1) may best satisfy one or more predetermined error constraints to produce substantially uniform error distribution across the predetermined interval, thereby addressing oscillatory behavior at the interval's boundaries.

As shown in steps S3020-S3025, the at least one processor 2 may generate, based on the outcome approximation function, schematic circuit data (e.g., 120SCH of FIG. 3). As known in the art, such schematic circuit data may be translatable into a physical layout design for an Integrated Circuit (IC). In the context of the present invention, the generated schematic circuit data 120SCH may be translatable into an electrical approximation circuit (e.g., 120AC of FIGS. 3, 4). The at least one processor 2 may output instructions for manufacturing the integrated circuit based on this physical layout design, to generate electrical approximation circuit 120AC as an IC, or a portion thereof. The IC may thereby be adapted to receive a signal representing an input value (e.g., x) within the predetermined interval, and produce an output signal representing an estimation of the target function 20 at the input value (e.g., f(x)), according to the outcome approximation function.

As explained herein, embodiments of the invention may provide a practical application in the field of circuit and chip design, allowing practitioners a degree of freedom for optimizing their design in view of predefined computational resources, and accuracy requirements.

Additionally, embodiments of the invention utilize the optimization process as elaborated herein, to introduce additional constraints to the objective function 130F. Embodiments of the invention may thereby enforce these constraints on the approximation problem, resulting in boundaries that are perfectly matched, or levelled.

In other words, the polynomial approximation may oscillate around the target function, minimizing the maximal error within the interior of the interval, and be substantially exact at selected points. As shown in FIG. 2B, the produced error function will not spike at the interval's extremities or boundaries, its peaks will not surpass the levelled error, and it will still exhibit the equioscillation property, thereby bounding the error function within a maximal absolute value.

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. A method of generating, by one or more processors, instructions for manufacturing an electrical approximation circuit that approximates a target function over a predetermined interval with uniform error distribution, the method comprising:

generating an initial approximation function, approximating the target function over the predetermined interval;

constructing an objective function based on the initial approximation function, wherein the objective function is configured to control error distribution at the predetermined interval's boundaries;

performing an iterative optimization process on the objective function to find a set of outcome coefficient values that define an outcome approximation function, wherein the outcome approximation function (a) approximates the target function, satisfying an accuracy requirement and (b) produces substantially uniform error distribution across the predetermined interval, thereby addressing oscillatory behavior at the interval's boundaries;

generating, based on the outcome approximation function, schematic data translatable into a physical layout design for an integrated circuit; and outputting instructions for manufacturing the integrated circuit based on the physical layout design, wherein the integrated circuit is adapted to:

receive a signal representing an input value within the predetermined interval; and produce an output signal representing an estimation of the target function at the input value according to the outcome approximation function.

2. A system for designing an integrated circuit, adapted to calculate an approximation of a target function over a predetermined interval, the system comprising: a non-transitory memory device, wherein modules of instruction code are stored, and at least one processor associated with the memory device, and configured to execute the modules of instruction code, whereupon execution of said modules of instruction code, the at least one processor is configured to:

employ an approximation algorithm, to calculate a first approximation function, approximating the target function, wherein the first approximation function is defined by an initial set of coefficient values;

construct an objective function based on the first approximation function;

based on the objective function, calculating a first set of outcome coefficient values, which define an outcome approximation function; and based on the outcome approximation function, generate and output an approximation circuit schematic, which represents an electrical approximation circuit, wherein the electrical approximation circuit is adapted to (i) receive an input value within the predetermined interval, and (ii) produce an estimation of the mathematical function at the input value, according to the outcome approximation function.

3. The system of claim 2, wherein the approximation circuit schematic is adapted to be translated into a physical layout design, utilizable for fabricating an Integrated Circuit that comprises the electrical approximation circuit.

4. The system of claim 2, wherein the at least one processor is further configured to:

calculate an initial error function, describing a difference between the target function and the first approximation function along the interval;

identify a set of peak points of the initial error function;

receive a requirement of target accuracy for approximating the target function at the set of peak points; and minimize the objective function, to find the first set of outcome coefficient values, such that the outcome approximation function satisfies the target accuracy requirement.

5. The system of claim 4, wherein the at least one processor is further configured to:

obtain a set of coefficient constraints, defining desired properties of coefficients of the outcome approximation function;

construct the objective function further based on the set of coefficient constraints; and minimize the objective function, to find the first set of outcome coefficient values, wherein the first set of outcome coefficient values comply with the coefficient constraints.

6. The system of claim 5, wherein said coefficient constraints are selected from a list consisting of: a representation of one or more coefficients, a precision of representation of one or more coefficients, and a rounding of one or more coefficients.

7. The system of claim 5, wherein the at least one processor is further configured to:

obtain a set of polynomial power constraints, defining properties of powers of the outcome approximation function;

construct the objective function further based on the set of polynomial power constraints; and minimize the objective function such that powers of the outcome approximation function comply further with the set of polynomial power constraints.

8. The system of claim 7, wherein the at least one processor is further configured to:

obtain one or more computational constraints, defining limitations for computational resource consumption of the electrical approximation circuit;

assess compliance of the electrical approximation circuit with the computational constraints; and when such compliance is not achieved, iteratively modify the polynomial power constraints and/or the coefficient constraints until the computational constraints are met.

9. The system of claim 8, wherein the computational constraints are selected from a list consisting of a limitation of silicon area in the electrical approximation circuit, power consumption of the electrical approximation circuit, latency of the electrical approximation circuit, and computing cycles required by the electrical approximation circuit.

10. The system of claim 5, wherein the at least one processor is further configured to:

obtain a set of error constraints, defining a behaviour of a desired error function, which represents difference between the target function and the outcome approximation function along the interval;

construct the objective function further based on the set of error constraints; and minimize the objective function such that the desired error function complies further with the set of error constraints.

11. The system of claim 2, wherein the at least one processor is further configured to:

calculate an approximation error of the outcome approximation function at the set of peak points;

employ the approximation algorithm, based on (i) coefficients of the first outcome approximation function, and (ii) the calculated approximation error, to produce a second version of the outcome approximation function; and generate the approximation circuit schematic based on the second version of the outcome approximation function.

12. A method of calculating, by at least one processor, an approximation of a target function over a predetermined interval, the method comprising:

employing an approximation algorithm, to calculate a first approximation function, approximating the target function, wherein the first approximation function comprises an initial set of coefficient values;

calculating an initial error function, describing a difference between the target function and the first approximation function along the interval;

identifying a set of peak points of the initial error function;

receiving a requirement of a target accuracy for approximating the target function at the set of peak points;

obtaining a set of coefficient constraints, defining desired properties of coefficients of an outcome approximation function;

constructing an objective function based on the first approximation function and the set of coefficient constraints;

minimizing the objective function, to find a first set of outcome coefficient values, that (a) define the outcome approximation function, and (b) comply with the coefficient constraints, wherein the outcome approximation function satisfies the target accuracy requirement; and using the outcome approximation to execute an instruction of an instruction set in software or hardware.

13. The method of claim 12, further comprising:

generating, based on the outcome approximation function, an approximation schematic, representing an electrical approximation circuit, wherein the electrical approximation circuit is adapted to:

receive a signal representing an input value within the predetermined interval; and produce an output signal, representing an estimation of the mathematical function at the input value according to the outcome approximation function.

14. The method of claim 13, wherein the approximation schematic is adapted to be translated into a physical layout design, utilizable for fabricating an Integrated Circuit that comprises the electrical approximation circuit.

15. The method of claim 12, wherein said coefficient constraints are selected from a list consisting of: a representation of one or more coefficients, a precision of representation of one or more coefficients, and a rounding of one or more coefficients.

16. The method of claim 12, further comprising:

obtaining a set of polynomial power constraints, defining properties of powers of the outcome approximation function;

constructing the objective function further based on the set of polynomial power constraints; and minimizing the objective function such that powers of the outcome approximation function comply further with the set of polynomial power constraints.

17. The method of claim 16, wherein said polynomial power constraints are selected from a list consisting of: using only even power polynomials, using only odd power polynomials, and using only powers selected from a list of predetermined power values.

18. The method of claim 12, further comprising:

obtaining a set of error constraints, defining a behaviour of a desired error function, which defines a difference between the target function and the outcome approximation function along the interval;

constructing the objective function further based on the set of error constraints; and minimizing the objective function such that the desired error function complies further with the set of error constraints.

19. The method of claim 18, wherein said error constraints are selected from a list consisting of: requirement for oscillation of the desired error function, requirement for the desired error function to have sign-alternating peaks, limitation of an absolute value of the desired error function by a predetermined error level, and determination of a maximal value of the desired error function at extremities of the interval.

20. The method of claim 18, wherein minimizing the objective function comprises an iterative process, where each iteration comprises:

perturbating a current set of coefficient values, of a current iteration, to find a new set of coefficient values that (a) define an interim approximation function, and (b) comply with the coefficient constraints;

estimating an accuracy value of the interim approximation function, over a predefined set of input points;

when the estimated accuracy satisfies the target accuracy requirement, returning the interim approximation function as a first version of the outcome approximation function; and when the estimated accuracy does not satisfy the target accuracy requirement, repeating the iterative process, with the new set of coefficient values serving as the current set of coefficient values, for a subsequent iteration.

* * * * *